United States Patent [19]

Von Dach

[11] Patent Number: 4,562,370
[45] Date of Patent: Dec. 31, 1985

[54] METHOD FOR ADJUSTING THE FREQUENCY OF A PIEZOELECTRIC CRYSTAL RESONATOR

[76] Inventor: Bernard Von Dach, Rue des Tertres 2, 2074 - Marin - Neuchâtel, Switzerland, R.47/4

[21] Appl. No.: 112,281

[22] Filed: Jan. 15, 1980

[30] Foreign Application Priority Data

Jan. 18, 1979 [CH] Switzerland ............................ 473/79

[51] Int. Cl.⁴ ............................................ H01L 41/08
[52] U.S. Cl. ...................................... 310/312; 29/25.35
[58] Field of Search ............... 310/312; 29/25.35, 593; 219/121 LM; 134/1; 51/319

[56] References Cited

U.S. PATENT DOCUMENTS

Re. 30,506  2/1981  Nakata ................................ 310/312
3,913,195  10/1975  Beaver ............................. 310/312 X
3,969,640  7/1976  Staudte .............................. 310/312
4,062,154  12/1977  Hugenin et al. ................. 310/312 X
4,131,484  12/1978  Caruso et al. .................... 310/312 X

FOREIGN PATENT DOCUMENTS 2335495  1/1975  Fed. Rep. of Germany ...... 310/312

Primary Examiner—Mark O. Budd
Attorney, Agent, or Firm—Silverman, Cass & Singer, Ltd.

[57] ABSTRACT

A process for adjusting the frequency of a resonator by bursts of laser beam shots which pierce successive lines or holes in a metal coating deposited on the resonator. The amount of material removed by a burst of shots varies in the course of the operating procedure so that the frequency of the resonator is adjusted towards the desired frequency by successive approximations. After each burst of shots, the frequency of the resonator is compared to a provisional limit frequency. The amount of material removed in the following line and the provisional limit frequency are changed or left unaltered, depending on the result of the comparison.

3 Claims, 7 Drawing Figures

METHOD FOR ADJUSTING THE FREQUENCY OF A PIEZOELECTRIC CRYSTAL RESONATOR

BACKGROUND OF THE INVENTION

The present invention concerns a method for adjusting the frequency of a piezoelectric crystal resonator by removing material by means of laser beam shots or pulses which are produced in bursts.

The invention also concerns the piezoelectric crystal resonator produced by carrying out this method.

It is known in particular from U.S. Pat. No. 3,766,616 how to adjust the frequency of a piezoelectric crystal resonator, for example a quartz resonator, by removing a metal layer which partially covers the piezoelectric crystal, the removal of material being effected in a point wise manner. The effect of removing material in this way, which can be performed by using laser beam shots, is to increase the frequency of the resonator which is subjected to this treatment. The frequency of the resonator is measured and compared to the desired frequency after each shot, and, if the measured frequency is lower than the desired frequency, a fresh or succeeding shot is fired. The operation is concluded when the measured frequency is equal to the desired frequency.

The degree of accuracy in measuring the frequency is directly linked to the duration of the measurement operation. Each measurement operation is effected with the maximum degree of accuracy, so that this process suffers from the disadvantage of taking up a fairly long period of time to complete the process. This is incompatible with the requirements of manufacturing the resonators on a very large scale.

The aim of the present invention is to improve the method of using laser beams for the purposes of adjusting the frequency of such a resonator, by reducing to a minimum the total amount of time required for adjusting the frequency thereof.

SUMMARY OF THE INVENTION

In accordance with the invention bursts of laser beam shots are directed onto material overlying a resonator to remove the material from the resonator and adjust the frequency of the resonator. The bursts of shots are applied between successive sequences of measuring the resonator frequency and comparing the measured frequency to a limit frequency when the measured frequency is less than or equal to the limit frequency. The amount of material removed in successive bursts of shots may be reduced and the limit frequency increased when the measured frequency is higher than the limit frequency to raise the resonator frequency to a desired adjustment frequency in successive approximations. The resonator includes a piezoelectric crystal at least partially covered by the material to be removed by the bursts of laser beam shots, the bursts removing material by forming holes in the material in a pattern of lines. The material may be evenly distributed on the crystal surface in which case the amount of material removed is varied by varying the density of the holes per line or the material may be distributed in the crystal surface in regions having varying densities in which case the amount of material removed is varied by varying the placement of the lines in the regions.

BRIEF DESCRIPTION OF THE DRAWING

The accompanying drawing shows by way of example two embodiments of the process according to the invention, and an alternative form.

DESCRIPTION OF THE PREFERRED EMBODIMENT

Figure 1:
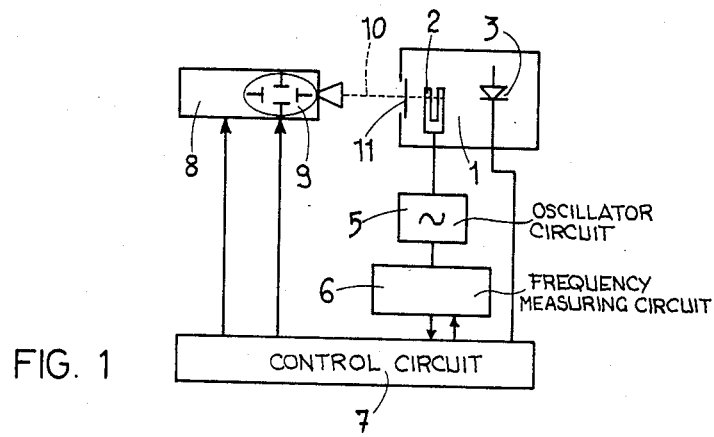
FIG. 1 is a diagrammatic view of an installation for adjusting the frequency of a quartz resonator.
Figure 2:
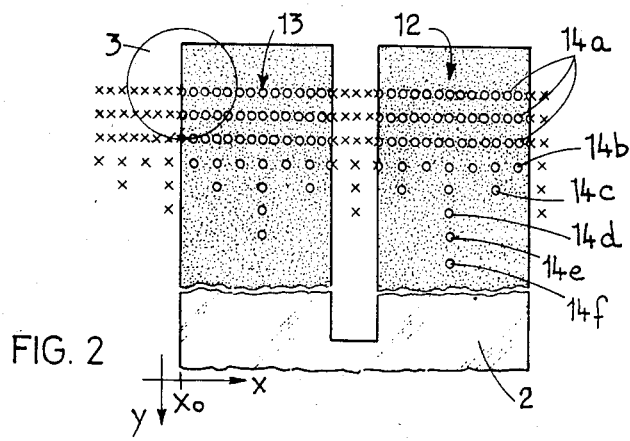
FIG. 2 is a plan view of a part of a quartz resonator whose frequency has been adjusted by laser beam shots, in accordance with a first embodiment of the present process.

The installation for frequency adjustment of a resonator, as shown in FIG. 1, comprises a vacuum chamber 1 containing the crystal whose frequency is to be adjusted, as indicated at 2. The crystal, which is of the tuning fork type, is mounted on a support (not shown). A photoelectric cell 3 is positioned to the rear of the crystal to enable the position thereof to be determined. The oscillations of the crystal are maintained by an oscillator circuit 5. A frequency measurement circuit 6 measures the frequency of the oscillations of the crystal. The duration of the measurement operation, which defines the degree of accuracy of the measurement operation, is given by a control device 7 which may comprise a microcomputer. The control device 7 further controls a laser 8 and a means 9 for deflecting the laser beam, as indicated at 10, which can be displaced along an axis X which is substantially perpendicular to the long sides of the crystal 2, and along an axis Y which is perpendicular to the axis X (See FIG. 2). Disposed at the front of the chamber 1 is a transparent plate 11 which allows the laser beam 10 to pass therethrough.

The mode of operation of this installation is as follows:

The crystal 2 whose frequency is to be adjusted is placed in the chamber 1 in which a vacuum is established. The crystal 2 is caused to oscillate electrically and its oscillations are maintained at their natural frequency by the oscillator 5. The frequency measurement circuit 6 measures the ocsillation frequency of the crystal and the control device 7 compares that frequency to a frequency which is referred to as the "provisional limit frequency," which will be described hereinafter. If the result of the comparison operation indicates that the frequency of the crystal is lower than or equal to the provisional limit frequency, the control device 7 orders the laser 8 to fire a series or burst of shots or pulses of the laser beam 10 in order to pierce a metal coating 12 (FIG. 2) with which the crystal is partially covered, and thus form in the metal coating 12 holes 13 which are intended to lighten the ends of the limbs or tines of the tuning fork shape and thus increase its natural frequency.

The deflection means 9 are also controlled by the control device 7 so that the laser beam shots are distributed along lines which are parallel to the axis X, and the different lines are separated from each other by a given distance.

In a first embodiment of the process according to the invention, the density D of a burst of shots, that is to say, the number of shots per unit of length, may be different from one line to the other, producing lines which are not identical. Thus, in the example shown in FIG. 2, the density of shots is the same for three lines 14a, and decreases by a half respectively in successive lines 14d to 14f.

The shot density D may be modified either by changing the frequency of the shots, while maintaining a constant speed of deflection parallel to the axis X or by changing the speed of deflection while maintaining the shot frequency.

Figure 3:
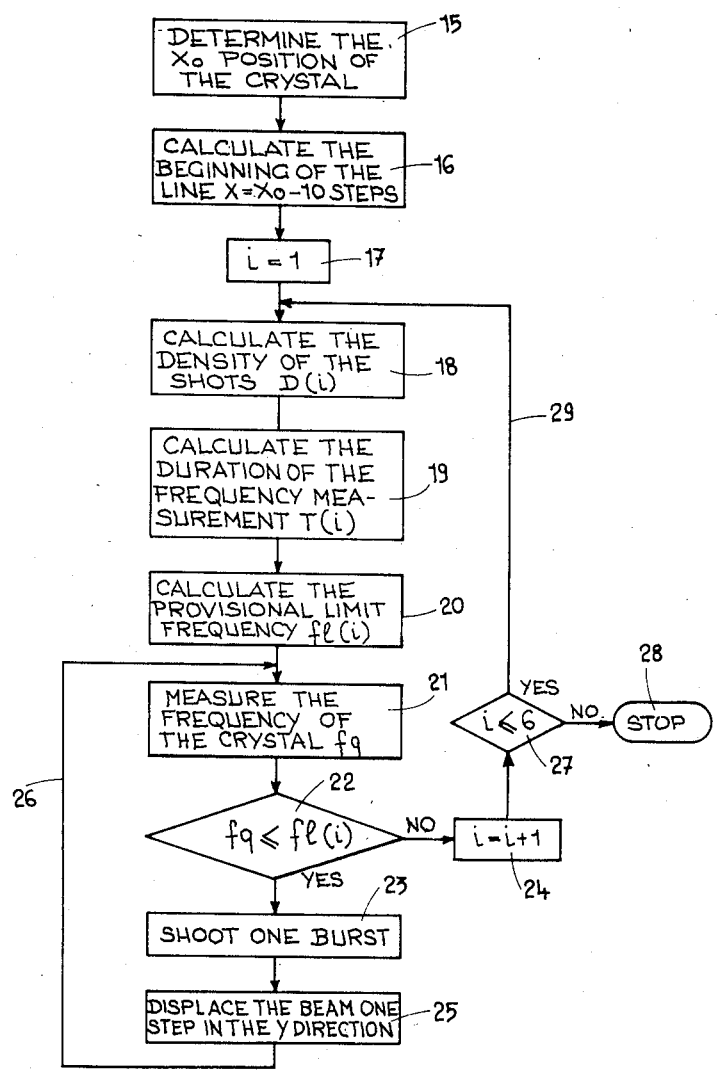
FIG. 3 is a flow chart showing the different stages in the first embodiment of the present process for resonator frequency adjustment, as applied to the resonator of FIG. 2.

The last line 14f generally only has one hole. In order to make sure that the shot for making this hole will be placed on the tuning fork shape, it is necessary for the position of the tuning fork to be determined accurately. For this purpose, and as indicated by block 15 in FIG. 3 which shows a flow chart of the present process, the adjustment procedure is begun by a series of shots at low power, which is insufficient to pierce the metal coating 12. The first shots are aimed clearly outside of the tuning fork shape, and the deflection means 9 is so controlled as to displace the beam of the laser in the direction of the axis X. The photoelectric cell 3, which is shown diagrammatically in FIG. 2 and which is positioned behind the plane of the resonator 2, receives the laser beam 10 emitted by the laser and supplies a signal to the control device 7. When the laser beam 10 is intercepted by the crystal, the signal from photoelectric cell 3 is not produced, thereby indicating the position $X_o$ of the edge of the resonator, for the control device 7.

When the position $X_o$ has been determined in this way, the control device 7 acts on the deflection means 9 so as to return the beam a certain number of steps in a reverse direction, for example ten steps (block 16). The control device 7 also acts on the laser 8 so as to increase the power of the beam 10 which is then made capable of piercing the metal coating 12.

An order factor i which determines inter alia the shot density D is then fixed at its initial value, being 1 in this example (block 17).

The density D of the shot, for each line or burst, is calculated on the basis of the following formula:

$$D(i)=D_o \cdot 2^{-(i-1)}$$

in which $D_o$ is the density of the first burst of shots and i varies from 1 to n, n representing the number of possible values of i and D and being selected as 6 in the embodiment described (block 18).

The amount Q of material removed by each burst of shots is obviously proportional to the density D of the burst and therefore is in accordance with a similar law:

$$Q(i)=Q_o \cdot 2^{-(i-1)}$$

in which $Q_o$ is the amount of material removed by the first burst.

The frequency adjustment operation involves successive measurements of the instantaneous frequency of the crystal. For the first or early measurement operations, it is sufficient to measure the frequency of the crystal with a relatively low degree of accuracy, thereby allowing a short duration T of each measurement operation. On the other hand, the duration T of the measurement operations must be increased in proportion to the nearness of the measured frequency to the desired final frequency $f_o$, since, as is known, the accuracy of a frequency measurement operation depends on the duration thereof. The duration of the operation of measuring the instantaneous frequency of the crystal, namely T(i), is given by the equation $T(i)=T_o \cdot 2^{-(n-i)}$, in which $T_o$ is the duration of the measurement operation which makes it possible to achieve the desired maximum degree of accuracy. Calculation of the duration of the measurement operation is indicated by block 19.

The "provisional limit frequency" $f_l$ is then calculated. This limit frequency is the maximum frequency at which it is still possible to shoot a complete line or burst, after which the frequency of the crystal is within a tolerance defined relative the final frequency. The limit frequency takes into account the amount of material removed by the burst and the tolerance thereof, and also the tolerance of the frequency measurement operation. The limit frequency $f_l$ must be reviewed for each value of the order factor i, and complies with the following formula:

$$f_l(i)=f_o(1-(\Delta f \cdot Q(i)Q_o)-e),$$

in which $f_0$ is the final frequency, $\Delta f$ is the variation in the frequency of the crystal, which is caused by the maximum density shot, and e is a safety coefficient which takes account the tolerances of the measurement and comparison operations. Calculation of $f_l$ is indicated by block 20.

Block 21 indicates that the instantaneous frequency $f_q$ of the quartz is then measured with the duration of the measurement operation being equal to T(i).

The measured frequency $f_q$ is then compared to the limit frequency $f_l$ which has been calculated for the respective order factor i in question. This operation is indicated by block 22. Two situations may occur:

(1) If $f_q$ is lower than or equal to $f_l(i)$, then a burst of shots is fired, as indicated by block 23, with the density as determined at block 18.

After the burst of shots has been fired and the beam has been displaced one step in the direction Y (block 25), the operations are repeated, as indicated by arrow 26, starting from the measurement of the instantaneous frequency $f_q$ of the crystal. Bursts of shots continue to be fired, with the same shot density, as long as $f_q \leq f_l(i)$.

If, in contrast, $f_q > f_l(i)$, the order factor i is increased by one unit (block 24) and it is compared, in block 27, with the predetermined value n, namely 6 in this described embodiment.

If i is greater than n, operation of the installation is interrupted, as indicated by block 28. If, on the other hand, i is less than or equal to n, the operations are resumed, as indicated by arrow 29, at the stage of calculating the density of the shots.

Figure 4:
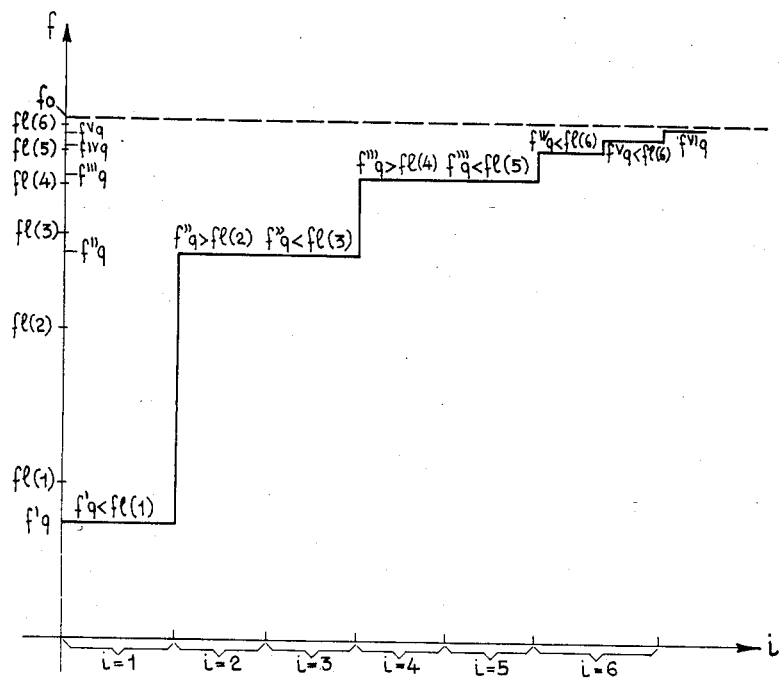
FIG. 4 is a diagram representing the change in the frequency of the resonator during adjustment thereof.

The diagram shown in FIG. 4 shows an example of the variation in the frequency of a crystal, during the different operations described above. The frequencies f are shown on the ordinate while the order factor i is shown on the abscissa. The reference frequency towards which the frequency of the crystal 2 is moved is indicated by $f_o$. The different provisional limit frequencies, for i=1, i=2, i=3, i=4, i=5 and i=6, have been entered along the axis of the frequencies, and are indicated respectively by $f_l(1)$, $f_l(2)$, $f_l(3)$, $f_l(4)$, $f_l(5)$ and $f_l(6)$.

The first measured frequency of the crystal is indicated by $f_q'$. It will be seen that $f_q'$ is below the frequency $f_l(1)$, so that firing of the laser beam is effected, with a shot density which is calculated with the order factor i=1. This burst of shots adjusts the frequency of the crystal to the value $f_q''$ which, as shown in the graph, is higher than the provisional limit frequency for i=2, namely $f_l(2)$. Hence, there are no laser beam shots to be produced at a density which has been calculated with the order factor i=2. On the other hand, $f_q''$ being lower than $f_l(3)$, a burst of shots is fired with the factor i=3, whereby the frequency of the crystal is adjusted to a fresh value $f_q'''$, which as shown in the graph, is higher than the value of $f_l(4)$. Therefore no shots are fired with the factor i=4. Yet, $f_q'''$ is lower than $f_l(5)$ and shots are fired with the order factor i=5. The fresh frequency of the crystal $f_q^{IV}$ being lower than $f_l(6)$, a burst of shots is fired with the order factor i=6. As the fresh frequency $f_q^{V}$ is still lower than $f_l(6)$, a second burst of shots is fired with the same factor i=6. Finally, the fresh frequency $f_q^{VI}$ is lower than $f_l(6)$ and no other burst is fired, the frequency of the crystal 2 being considered good, that is to say, within an allowable tolerance.

Each of the instantaneous frequencies $f_q$ of the crystal 2 is measured for a period of time T (i) so that the accuracy of the measurements progressively increases.

With a frequency measuring means which is provided with a time base of 10 MHz and for a value of $T_o$ of 125 ms, it is possible for the frequency measuring operation to achieve a degree of accuracy of $0.8 \cdot 10^{-6}$. Under these conditions, it is possible to adjust the frequency of a resonator within a period of time of the order of from 300 to 400 ms.

By using a frequency measuring device which has higher levels of performance, but which is obviously more expensive, it would be possible to achieve a sufficient degree of accuracy for a measurement time of the order of 10 ms. In this case, the measurement time could remain fixed throughout the operation.

Figure 5:
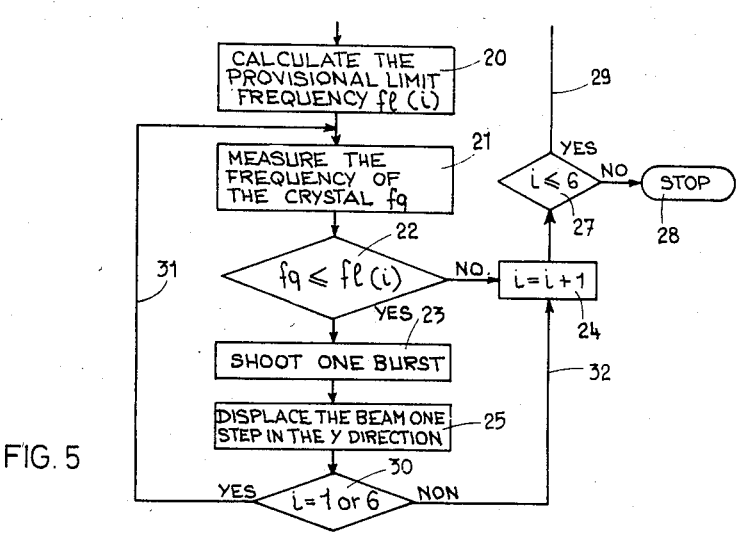
FIG. 5 is a flow chart of a part of the operations of an alternative embodiment of the first frequency adjustment process which is also applied to the resonator of FIG. 2.

If the crystal are held to within fairly close tolerances and if the laser is stable in power, it is possible further to reduce the time required for adjusting a crystal, by using the mode of operation of the alternative embodiment shown in FIG. 5. The mode of operation of FIG. 5 differs from that shown in FIG. 3 in that it does not include an operation of systematically verifying, after each burst of shots, whether a second burst at the same shot density is required. The arrow 26 is thus omitted. The verification operation is effected only for i=1 or i=6. This condition is indicated by block 30. If this condition is fulfilled, the operations are resumed at the step of measuring the frequency $f_q$ of the crystal, as indicated by arrow 31. If however this condition is not fulfilled, that is to say, if i is other than 1 or 6, the process is begun again at block 24, as indicated by arrow 32, by increasing the order factor i by a unit. In other respects, the mode of operation is the same as that described above.

Figure 6:
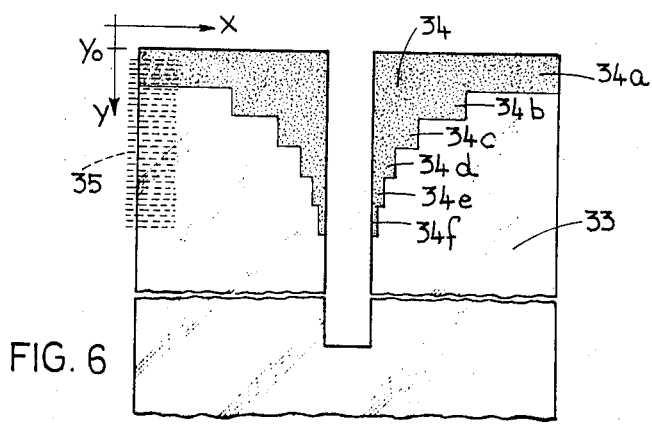
FIG. 6 is a plan view of a part of a quartz resonator whose frequency is to be adjusted by laser beam shots, using a second embodiment of the present process.

The resonator, a part of which is shown in FIG. 6, comprises a crystal which is in the shape of a tuning fork. The crystal, indicated generally by reference character 33, differs from that shown in FIG. 2 by virtue of the fact that the metal coating denoted by reference character 34 does not entirely cover the end of the limbs of the tuning fork shape, as was the case in the FIG. 2 construction. The metal coating 34 is deposited on each of the limbs of the tuning fork shape in adjoining strips 34a to 34f whose length L decreases in the Y direction in accordance with the formula: $L(i)=L_o \cdot 2^{-(i-1)}$, in which $L_o$ is the length of the first strip, which is equal to the width of one of the limbs of the tuning fork, and i is again an order factor which varies from 1 to 6. The height of each of the strips is such that it is possible to fire on each of the strips separate bursts, for example 5, along lines which are parallel to the X-axis, the position of such lines being shown in FIG. 6 by the dashed and dotted lines 35.

This arrangement means that there is no longer any need to reduce the density of the shots in the burst from one burst to the next. On the contrary, in this case it is possible for the density of shots in the different bursts to be kept constant, with the amount Q of material removed by a burst then being determined by the length L of the strip which is hit by the laser beam. In order to modify the amount Q of material removed when the measured frequency of the crystal is found to be higher than the provisional limit frequency, the laser beam is transferred from one strip of the metal coating 34 to the next.

Figure 7:
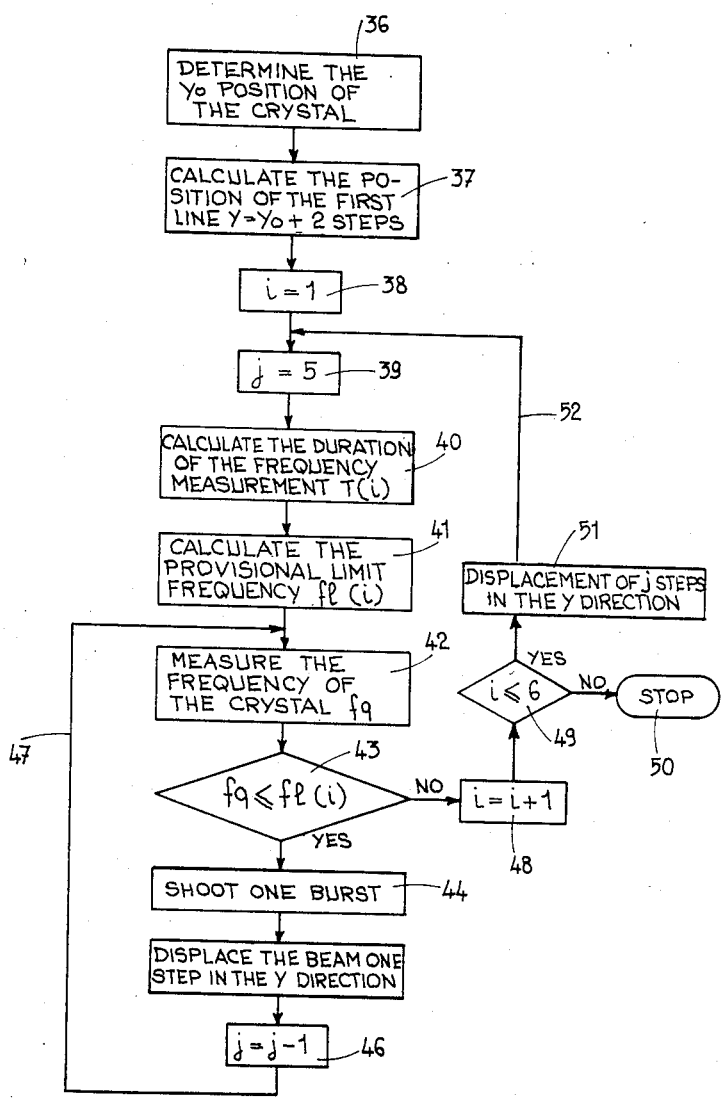
FIG. 7 is a flow chart of the different stages of the second embodiment of the frequency adjustment process as applied to the resonator of FIG. 6.

The process of adjusting a resonator of this kind is described by means of the flow chart in FIG. 7. The position $Y_o$ of the edge of the crystal in the direction of the Y-axis, is determined in a manner similar to the operation for determining the position $X_o$ of the crystal in the X-axis direction of the first embodiment of the process (block 36). When the position $Y_o$ has been determined, the control device 7 acts on the deflection means 9 in such a way that the laser beam 10 is moved two steps, for example, in the direction of the Y-axis, so that the first burst of shots is not fired too close to the upper edge of the tuning fork shape (block 37). The height of the first strip is also slightly greater than that of the following strips, in order to take into account this initial movement.

As in the first embodiment of the process, the value of the order factor i is then fixed at 1 (block 38). The value of another order factor j is also made equal to the maximum number of bursts which can be fired on a strip, that is to say, 5 in this described embodiment (block 39).

The following operations for calculating the duration T(i) of the frequency measuring operation (block 40), calculating the provisional limit frequency $f_l$ (i) (block 41), measuring the frequency $f_q$ of the crystal (block 42) and making a comparison between $f_q$ and $f_l$ (block 43) are the same as in the first embodiment there no longer being any reason to calculate the shot density.

If the frequency comparison indicates that $f_q \leq f_l(i)$, a burst of shots is fired (block 44) and the beam is moved one step in the direction of the Y-axis (block 45), as in the first embodiment. Then however, before restarting the measurement operation of the frequency $f_q$ of the crystal, the factor j is decremented by one unit (block 46). The procedure is continued until the result of the comparison operation (block 43) shows that $f_q > f_l(i)$. In this case, the factor i is incremented by one unit and compared to its maximum value (blocks 48 and 49) and, if the maximum value is exceeded, the procedure is stopped (block 50)

Otherwise, the beam is displaced j steps in the direction of the Y-axis (block 51) so that the next burst of shots is fired at the beginning of the following strip. Indeed, if, for example, two bursts of shots have been fired on one of the strips the factor j is 4, which is precisely the number of steps by which the beam is to be moved in order for the next burst of shots to be fired at the beginning of the next strip.

The procedure then begins again, as indicated by arrow 52, at block 39 in which the value of the factor j is again fixed at its maximum level.

If the manufacturing tolerances of the resonator are so great that the fifth burst fired into the same strip does not adjust the frequency of the crystal to a value which is higher than the provisional limit frequency, it is possible, after decrementation of the factor j at the block 46, to effect comparison between the value of the factor j and the value 0, so as to stop the operating procedure if j=0. Indeed, there is no purpose in trying to continue with adjustment of the crystal, if it cannot in any way be adjusted to the desired frequency.

What is desired to secure by Letters Patent of the United States is:

1. A method for automatically adjusting the frequency of a tuning fork type piezoelectric crystal resonator having tines to an adjustment frequency, comprising cyclically performing the steps of:
   causing said resonator to vibrate at its natural frequency;
   measuring said natural frequency;
   comparing said measured frequency with a predetermined limit frequency; and then either
   directing a burst of laser beam shots on said tines to remove substantially the same predetermined amount of material from each tine, said burst having a predetermined density if the measured frequency is less than or equal to said predetermined limit frequency;
   or increasing said limit frequency and decreasing the burst density if said measured frequency is greater than said limit frequency;
   the steps of measuring said natural frequency and directing the burst of laser beam shots being performed separately and non-simultaneously.

2. The method of claim 1, wherein said limit frequency and said shot density have a predetermined number n of possible values which depend on an order factor $i = 1, 2, 3, \ldots n$, said order factor remaining unchanged if said measured frequency is lower than or equal to said limit frequency, and being increased by one unit if said measured frequency is higher than said limit frequency, said density D being decreased according to the formula:

$$D(i) = D_0 \cdot 2^{-(i-1)}$$

in which Do is the density of the first burst of shots, and said limit frequency fl being increased according to the formula:

$$fl(i) = f_0(1 - (\Delta f \cdot D(i)/D_0) = e)$$

in which
   fo is said adjustment frequency,
   $\Delta f$ is the variation in the frequency of the resonator caused by a burst of shots with the density Do, and
   e is a safety coefficient taking into account measurement and comparison tolerances.

3. The method of claim 2, wherein said measuring is performed for a predetermined duration T which remains unchanged if said measured frequency is lower than or equal to said limit frequency, and which is increased, if said measured frequency is higher than said limit frequency, according to the formula:

$$T(i) = T_0 \cdot 2^{-(n-i)}$$

in which To is the measuring duration corresponding to a desired maximum precision.

* * * * *